US008259504B2

(12) United States Patent
Ting et al.

(10) Patent No.: US 8,259,504 B2
(45) Date of Patent: Sep. 4, 2012

(54) METHOD OF PROGRAMMING/ERASING THE NONVOLATILE MEMORY

(75) Inventors: Yun-Jen Ting, Hsinchu County (TW); Kai-Yuan Hsiao, Taichung (TW)

(73) Assignee: eMemory Technology Inc., Hsinchu Science Park, Hsin-Chu (TW)

( * ) Notice: Subject to any disclaimer, the term of this patent is extended or adjusted under 35 U.S.C. 154(b) by 472 days.

(21) Appl. No.: 12/503,821

(22) Filed: Jul. 15, 2009

(65) Prior Publication Data

US 2011/0013459 A1 Jan. 20, 2011

(51) Int. Cl.
*G11C 16/04* (2006.01)

(52) U.S. Cl. ........... 365/185.19; 365/185.2; 365/185.22; 365/185.24; 365/185.29

(58) Field of Classification Search ............. 365/185.19, 365/185.22, 185.2, 185.24, 185.29
See application file for complete search history.

(56) References Cited

U.S. PATENT DOCUMENTS

| | | | |
|---|---|---|---|
| 5,644,528 A * | 7/1997 | Kojima | 365/185.03 |
| 6,040,996 A | 3/2000 | Kong | |
| 6,651,032 B2 * | 11/2003 | Peterson et al. | 702/181 |
| 6,879,521 B2 * | 4/2005 | Furuyama | 365/185.24 |
| 7,266,019 B2 * | 9/2007 | Taoka et al. | 365/185.29 |
| 7,652,929 B2 * | 1/2010 | Li | 365/185.24 |
| 7,894,269 B2 * | 2/2011 | Li | 365/185.22 |
| 7,974,127 B2 * | 7/2011 | Chong et al. | 365/185.16 |
| 2006/0152974 A1 | 7/2006 | Bathul et al. | |
| 2008/0037330 A1 | 2/2008 | Park et al. | |

* cited by examiner

*Primary Examiner* — Pho M Luu
(74) *Attorney, Agent, or Firm* — Winton Hsu; Scott Margo

(57) ABSTRACT

Multi-stage pulses are used to program/erase the memory so as to reduce the slow program/erase bit issue. A first predetermined voltage bias is applied to a memory cell for a predetermined number of times. Each time the voltage bias is applied to the memory cell the memory is verified against a criterion. If the verification failed after the predetermined number of times applying the first predetermined voltage bias, a second predetermined voltage bias is applied to program/erase the nonvolatile memory. If the verification failed after applying the second predetermined voltage bias, a third predetermined voltage bias is applied to program/erase the nonvolatile memory.

12 Claims, 7 Drawing Sheets

METHOD OF PROGRAMMING/ERASING THE NONVOLATILE MEMORY

BACKGROUND OF THE INVENTION

1. Field of the Invention

The present invention relates to a programming/erasing method, and more particularly, to a programming/erasing method that effectively improves slow program/erase bit induced by process variation.

2. Description of the Prior Art

In nonvolatile memory applications, the data is processed by programming and erasing the memory cells of the memory array. Each action of programming or erasing is followed by a verification step. The verification step is to verify if the memory cell being programmed or erased are compliant to the specification. The verification step includes verifying criterions such as the current, voltage, or threshold voltage etc., of the programmed memory cell.

Due to process variation, the issue of slow program/erase bit arises. Slow program/erase bit occurs when a memory cell does not meet the desired criterion after being programmed or erased. Slow program/erase bit does not necessarily mean the particular memory cell is a failure. However the particular memory cell may take several programming or erasing retries for it to meet the verification criterion. Alternatively, the particular memory cell may still fail after several programming attempts. As a result, slow program/erase bit not only delays the program or erase time, but also causes the low production yield.

Please refer to FIG. 1. FIG. 1 is a diagram illustrating the conventional constant pulses for programming a nonvolatile memory. The conventional constant pulse program method programs a memory cell with a voltage $V_{CONSTANT}$. If the programmed memory cell fails the programming verification, the constant pulse program method re-programs the memory cell with the same voltage $V_{CONSTANT}$ again. For instance, as shown in FIG. 1, with six pulses of the constant voltage $V_{CONSTANT}$ indicates the constant pulse program method has programmed the memory cell for six times.

Please refer to FIG. 2. FIG. 2 is a flowchart illustrating the conventional constant pulse program method. The conventional constant pulse program method programs the nonvolatile memory with constant voltage pulses. The conventional constant pulse program method includes the following steps:

Step 200: Start and set a counter N to 0.

Step 201: Apply the voltage $V_{CONSTANT}$ to the memory cell.

Step 202: Perform a programming verification PV to verify the programmed memory cell is compliant to the criterion; if the verification passes, go to Step 205; otherwise, go to Step 203.

Step 203: Perform a program constrain check to verify if the program constrains have been exceeded; for example, if the number of times the memory cell has been programmed has exceeded a predetermined value n, or if the total programming time T has exceeded a predetermined time t; if exceeded, go to Step 205; otherwise, go to Step 204.

Step 204: The counter N is increased by 1 to indicate the number of times the memory cell has been programmed, and then go to Step 201.

Step 205: End.

The constant pulse program method requires a relatively simple peripheral circuit design. The constant pulse program method raises low component disturbance. However the constant pulse program method is inclined to the occurrence of slow program/erase bit.

Please refer to FIG. 3. FIG. 3 is a diagram illustrating the conventional ramping pulses for programming a nonvolatile memory. The ramping pulse program method requires a sensing circuit to provide a feedback if the programming verification is failed. The programming voltage of the ramping pulse program method is varied according to the feedback of the sensing circuit. For instance, the ramping pulse program method programs a memory cell with the voltage $V_{RAMP\_0}$. If the programmed memory cell fails the programming verification, the sensing circuit provides a feedback according to the failed specification. The ramping pulse program method then programs the memory cell with the voltage $V_{RAMP\_1}$ according to the feedback of the sensing circuit. If the programmed memory cell fails the programming verification again, the sensing circuit provides another feedback accordingly. The ramping pulse program method programs the memory cell with the voltage $V_{RAMP\_2}$ according to the feedback of the sensing circuit and so on. The number of ramping levels is theoretically indefinite and normally a ramping range is required for limiting the ramping voltage. Generally the voltage $V_{RAMP\_1}$ is greater than the voltage $V_{RAMP\_0}$. In other words, the $V_{RAMP\_N}$ is greater than the $V_{RAMP\_N-1}$. However, there are few occasions when the $V_{RAMP\_N-1}$ is greater than the voltage $V_{RAMP\_N}$.

Please refer to FIG. 4. FIG. 4 is a flowchart illustrating the conventional ramping pulse program method. The ramping pulse program method programs the nonvolatile memory with pulses of varying voltages. The conventional ramping pulse program method includes the following steps:

Step 400: Start and set a counter N to 0.

Step 401: Apply the voltage $V_N$ to the memory cell.

Step 402: Perform a programming verification PV to verify the programmed memory cell is compliant to the criterion; if the verification passes, go to Step 405; otherwise, go to Step 403.

Step 403: Perform a program constrain check to verify if the program constrains have been exceeded; for example, if the number of times the memory cell has been programmed has exceeded a predetermined value n, or if the total programming time T has exceeded a predetermined time t; if exceeded, go to Step 405; otherwise, go to Step 404.

Step 404: The counter N is increased by 1 to indicate the number of times the memory cell has been programmed.

Step 405: End.

Every time the memory cell is re-programmed, the counter N is incremented and resulting in varying the voltage $V_N$ of the next instance of re-programming. Each time the voltage $V_N$ is varied indicates the memory cell is being programmed with a voltage with a different voltage level. The ramping pulse program method requires a relatively complex peripheral circuit design due to the demand of a sensing circuit. The variation of the voltage $V_N$ is according to the feedback of the sensing circuit. Also, because of the ramping characteristics, the voltage applied to programmed memory cell is higher than the surrounding memory cells in the memory array. Therefore, the ramping pulse program method not only stresses the programmed memory cell but also cause disturbance to other memory cells.

Therefore, both the constant pulse program method and the ramping pulse program method are unable to solve the slow program/erase bit issue while maintaining a simple peripheral circuit design and low component disturbance.

SUMMARY OF THE INVENTION

It is therefore an objective of the present invention to provide a method for programming/erasing a nonvolatile memory to solve the above-mentioned problems.

The present invention provides a method for programming a nonvolatile memory. The method comprises applying a first predetermined voltage to a memory cell for a predetermined number of times, and applying a second predetermined voltage to the memory cell.

The present invention further provides a method for erasing a nonvolatile memory. The method comprises applying a first predetermined voltage to a sector of the memory for a predetermined number of times, and applying a second predetermined voltage to the sector of the memory.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
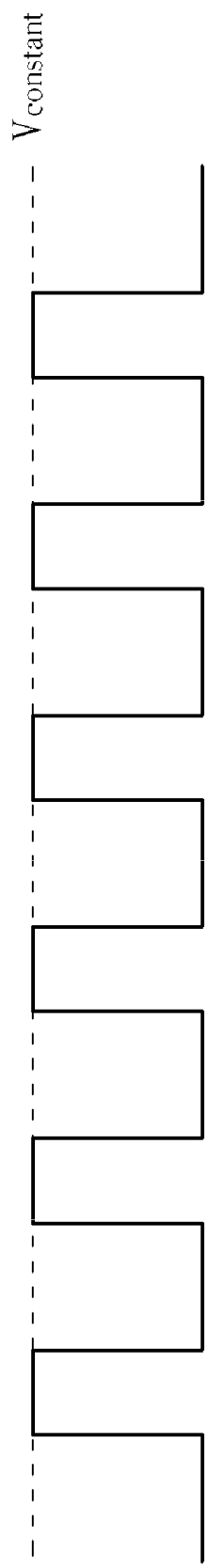
FIG. 1 is a diagram illustrating the conventional constant pulses for programming a nonvolatile memory.
Figure 2:
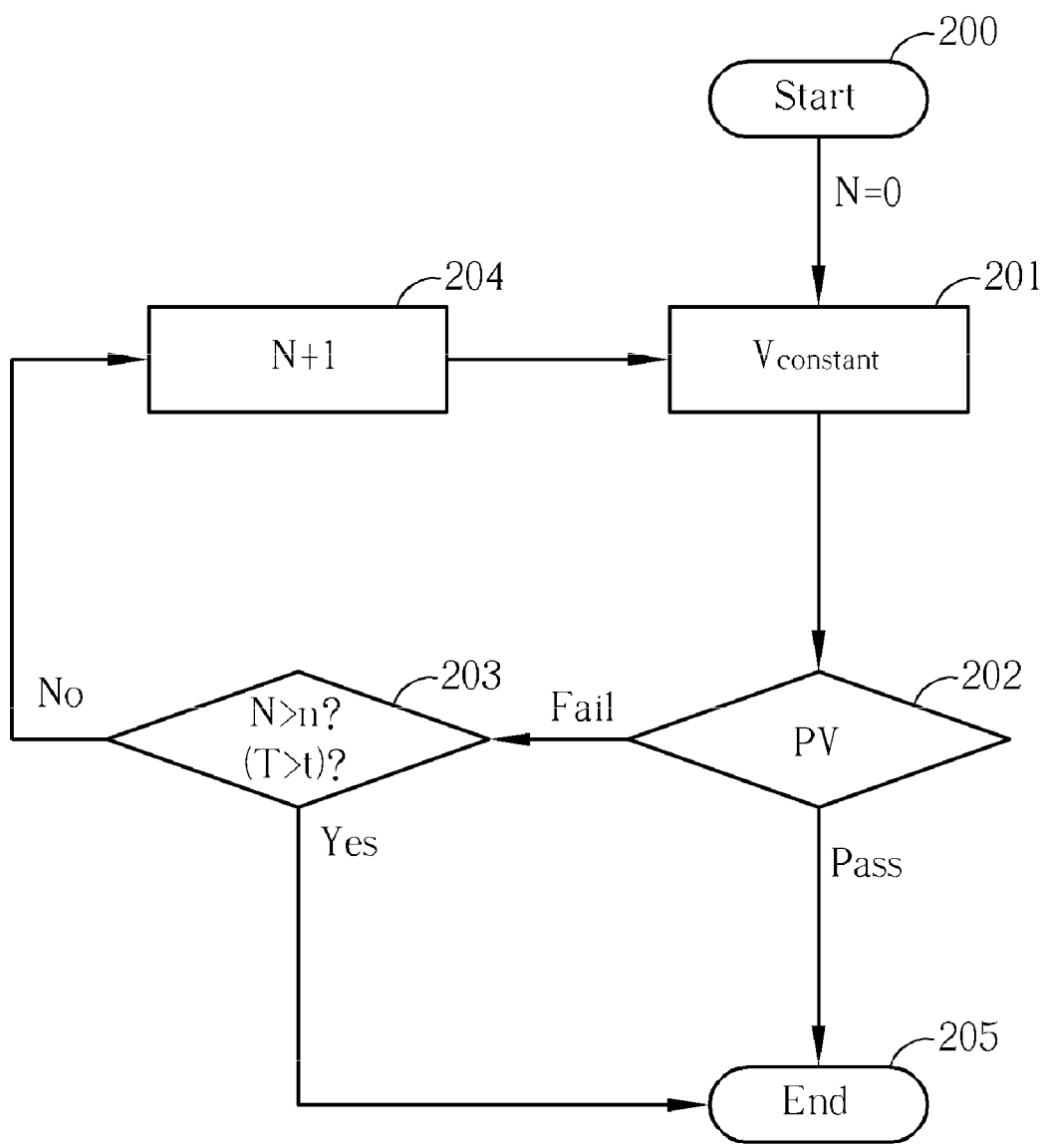
FIG. 2 is a flowchart illustrating the conventional constant pulse program method.
Figure 3:
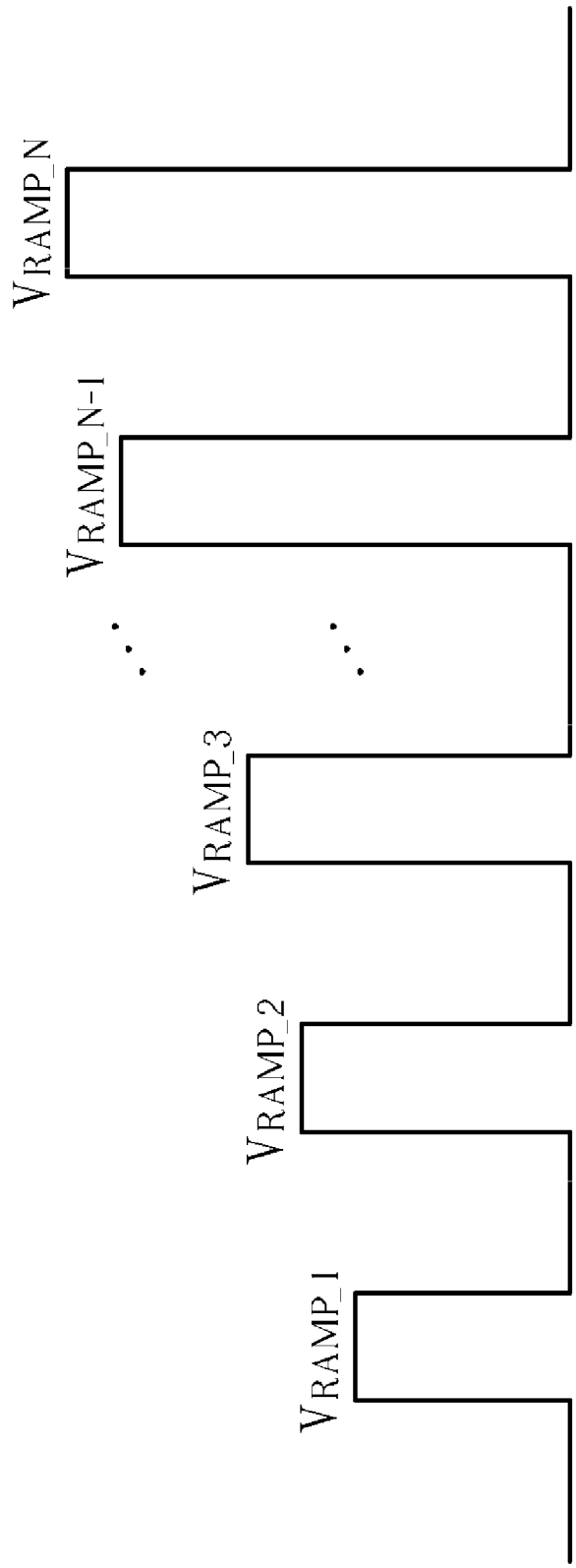
FIG. 3 is a diagram illustrating the conventional ramping pulses for programming a nonvolatile memory.
Figure 4:
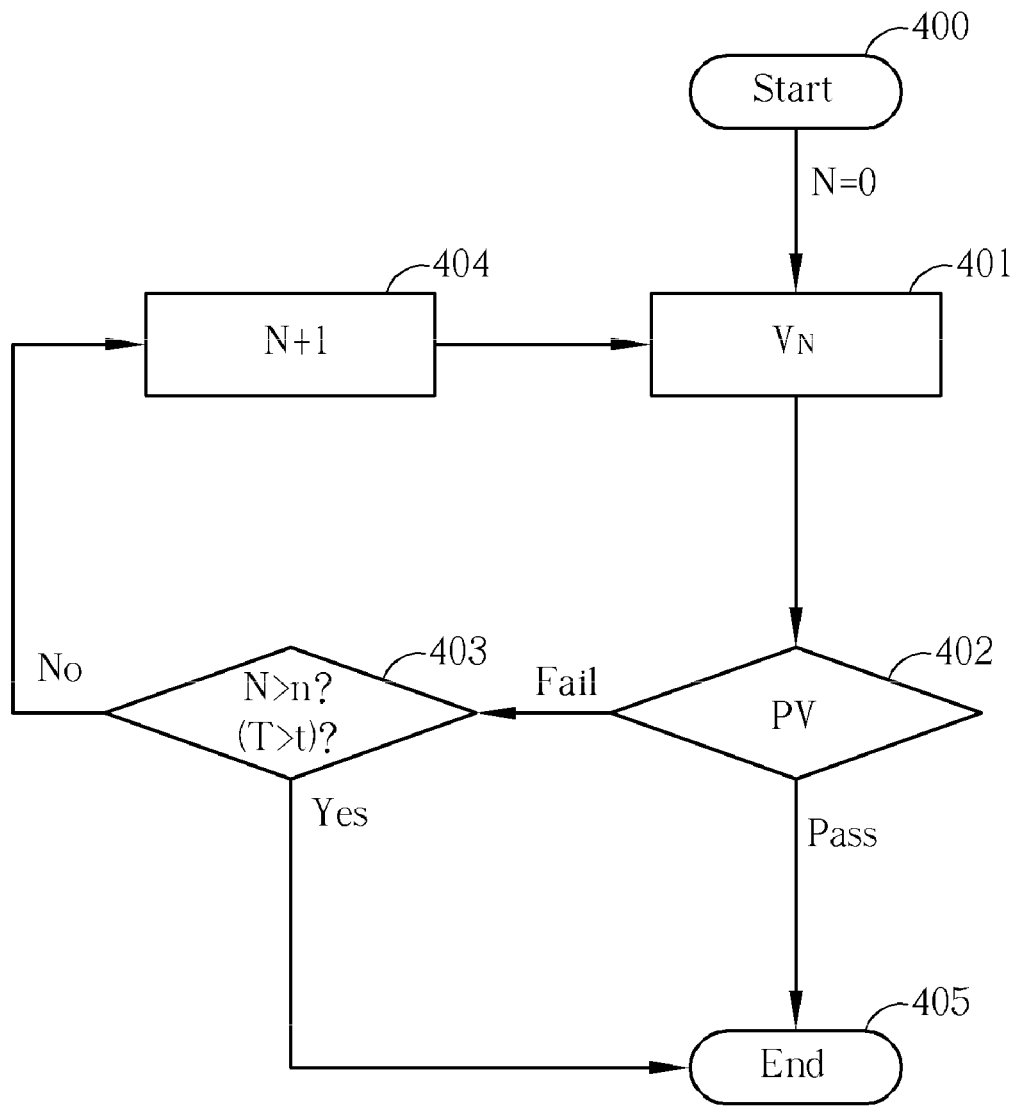
FIG. 4 is a flowchart illustrating the conventional ramping pulse program method.
Figure 5:
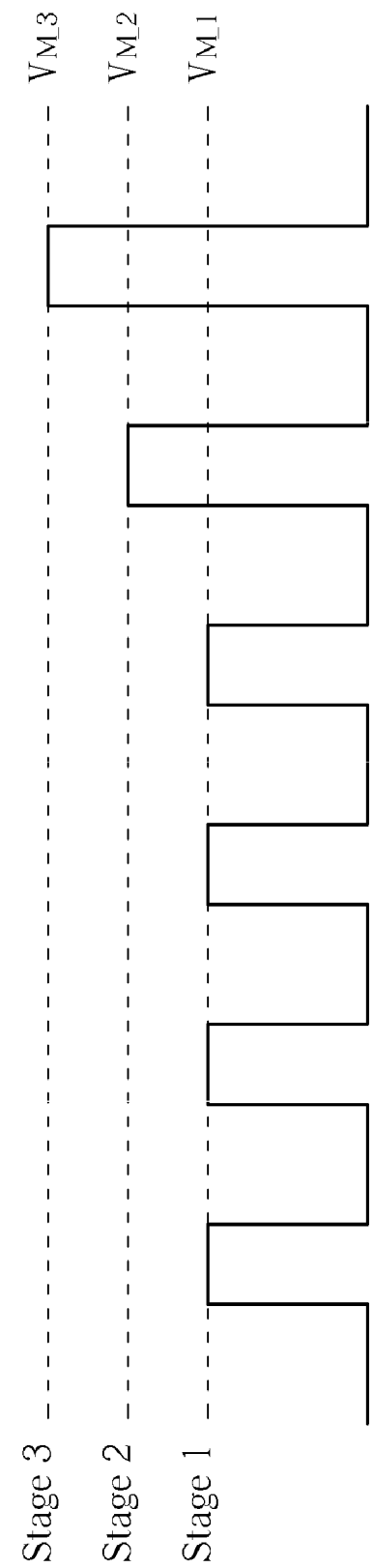
FIG. 5 is a diagram illustrating the multi-stage pulses according to the present invention.

Please refer to FIG. 5. FIG. 5 is a diagram illustrating the multi-stage pulses according to the present invention. The present invention uses the multi-stage pulses to program the memory cell. In this embodiment of the present invention, the multi-stage program method comprises three stages. In Stage 1, the multi-stage program method programs the memory cell with a predetermined voltage bias $V_{M\_1}$, and then performs a programming verification. If the programming verification fails, the memory cell is re-programmed with the voltage bias $V_{M\_1}$ until a predetermined number is reached.

The number of times of re-programming the memory cell is depended on the predetermined program constrains. The program constrains can be the total programming time, or the number of times the memory cell has been programmed. Once the program constrain has been exceeded without passing the programming verification, the multi-stage program method proceeds to Stage 2. In Stage 2, the multi-stage program method programs the memory cell with a predetermined voltage bias $V_{M\_2}$ for one time, and then performs the programming verification. If the memory cell programmed with the voltage bias $V_{M\_2}$ fails the programming verification, the multi-stage program method proceeds to Stage 3. In Stage 3, the multi-stage program method programs the memory cell with a predetermined voltage bias $V_{M\_3}$ for one time. The multi-stage program method is ended regardless of whether the memory cell programmed with the voltage bias $V_{M\_3}$ has passed the programming verification or not.

In other words, the memory cell is firstly programmed with the voltage bias $V_{M\_1}$ (Stage 1) and reprogramming until the programming verification is passed or until the program constrains are exceeded. Once the program constrains are exceeded, the memory cell is programmed with the voltage bias $V_{M\_2}$ (Stage 2) for one time. If the memory programmed with the voltage bias $V_{M\_2}$ fails the programming verification, the memory cell is programmed with the voltage bias $V_{M\_3}$ (Stage 3) for one time. The multi-stage program method ends regardless of the programming verification result of the memory programmed with the voltage bias $V_{M\_3}$.

The magnitudes of the voltage bias $V_{M\_1}$, $V_{M\_2}$ and $V_{M\_3}$ of the multi-stage program method are predetermined. As shown in FIG. 5, the voltage bias $V_{M\_3}$ is greater than the voltage bias $V_{M\_2}$ and the voltage bias $V_{M\_2}$ is greater than the voltage bias $V_{M\_1}$. The voltage bias $V_{M\_1}$ applied to the memory cell is constant during re-programming of Stage 1.

Figure 6:
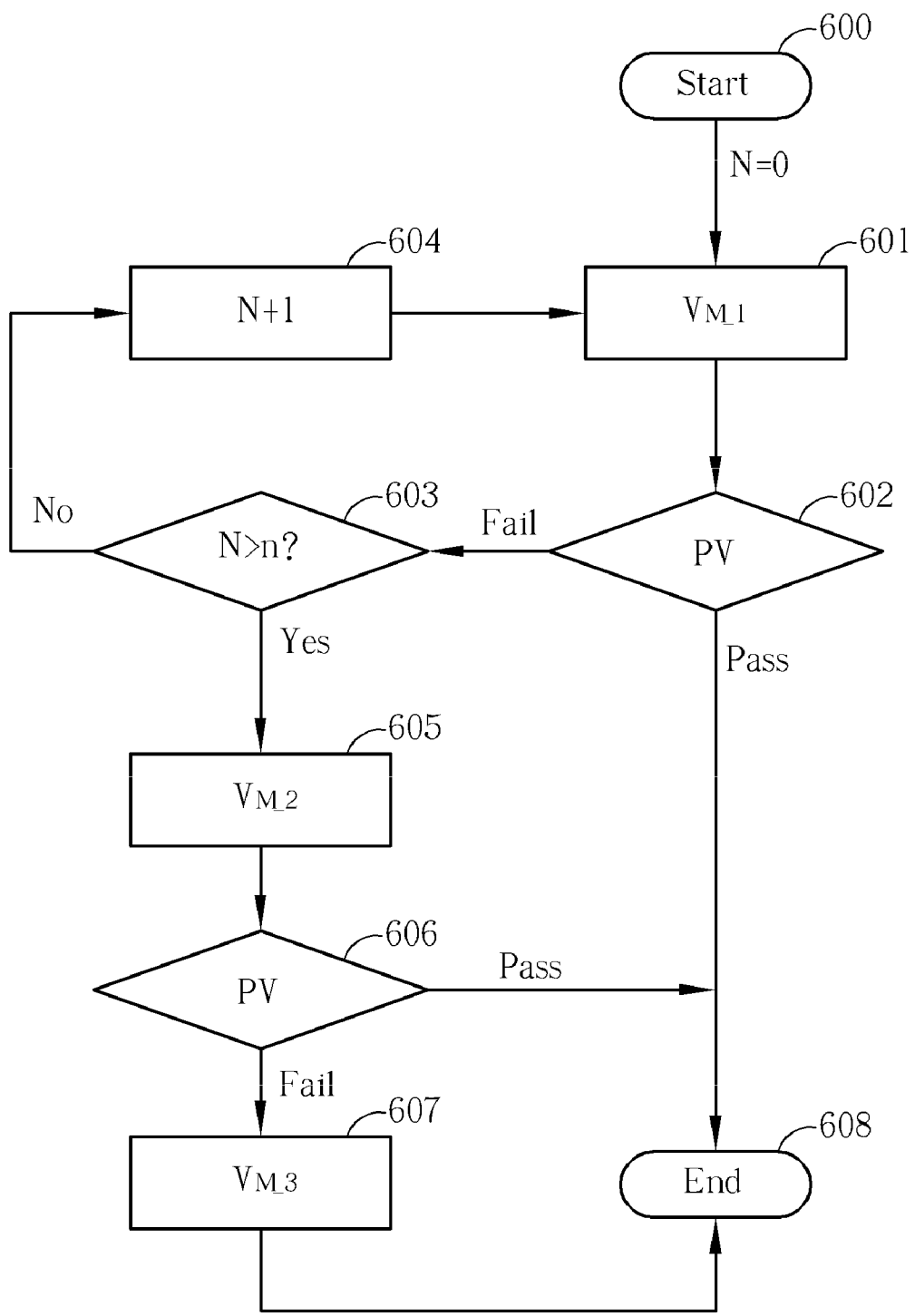
FIG. 6 is a flowchart illustrating the multi-stage program method according to the present invention.

Please refer to FIG. 6. FIG. 6 is a flowchart illustrating the multi-stage program method according to the present invention. The multi-stage program method programs the nonvolatile memory cell with predetermined voltage bias $V_{M\_1}$, $V_{M\_2}$ and $V_{M\_3}$ in three stages. The multi-stage program method includes the following steps:

Step 600: Start and set a counter N to 0.

Step 601: Apply the voltage bias $V_{M\_1}$ to the memory cell.

Step 602: Perform a programming verification to verify the memory cell programmed with the voltage bias $V_{M\_1}$ is compliant to the criterion; if the verification passes, go to Step 609; otherwise, go to Step 603.

Step 603: Perform a program constrain check to verify if the program constrain has been exceeded; for example, if the number of times the memory cell programmed with the voltage bias $V_{M\_1}$ has exceeded a predetermined value n; if exceeded, go to Step 605; otherwise, go to Step 604.

Step 604: The counter N is increased by 1 to indicate the number of times the memory cell has been programmed by the voltage bias $V_{M\_1}$.

Step 605: Apply the voltage bias $V_{M\_2}$ to the memory cell.

Step 606: Perform the programming verification to verify the memory cell programmed with $V_{M\_2}$ is compliant to the criterion; if the verification passes, go to Step 609; otherwise, go to Step 607.

Step 607: Apply the voltage bias $V_{M\_3}$ to program the memory.

Step 608: End.

In Step 603, assuming the program constrain is the predetermined number n. The counter N, which is the number of times the memory cell has been programmed by the voltage bias $V_{M\_1}$, is compared with the number n. If the counter N exceeds the number n, the multi-stage method then proceeds to Stage 2, which is Step 605, of the multi-stage program method.

If the memory cell programmed with the voltage bias $V_{M\_1}$ fails the programming verification for a predetermined number of times, the multi-stage program method improves slow program bit by modifying (i.e. increasing) the programming voltage bias for the finite and predetermined number of times. The modified programming voltage biases are the voltage bias $V_{M\_2}$ and $V_{M\_3}$. If the memory cell programmed with the voltage bias $V_{M\_1}$ failed the programming verification for the predetermined number of times, the multi-stage program method programs the memory cell with the voltage bias $V_{M\_2}$ for one time. If the programming verification still fails, the multi-stage program method performs the last step of programming the memory cell with the voltage bias $V_{M\_3}$ for one time.

Figure 7:
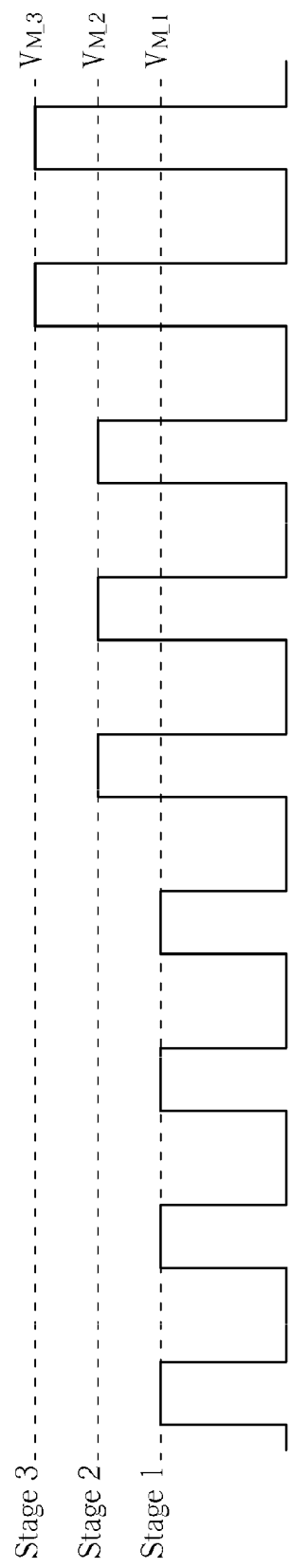
FIG. 7 is a diagram illustrating an alternative embodiment of the multi-stage program method according to the present invention.

Please refer to FIG. 7. FIG. 7 is a diagram illustrating an alternative embodiment of the multi-stage program method of the present invention. Similar to the embodiment of FIG. 5, the multi-stage program method of the present invention uses the multi-stage pulses to program the memory cell, and the multi-stage program method comprises three stages. In Stage 1, the multi-stage program method operates identically as the embodiment of FIG. 5.

In Stage 2, the multi-stage program method programs the memory cell with a predetermined voltage bias $V_{M\_2}$ for a predetermined number of times (e.g. 3 times), depending on the design requirement. Each time the memory cell is programmed the programming verification is performed. If the memory cell programmed with the voltage bias $V_{M\_2}$ fails all programming verifications, the multi-stage program method proceeds to Stage 3. In Stage 3, the multi-stage program method programs the memory cell with a predetermined voltage bias $V_{M\_3}$ for a predetermined number of times (e.g. 2 times), depending on the design requirement. Similar to Stage 2, each time the memory cell is programmed the programming verification is performed. The multi-stage program method is ended regardless of whether the memory cell programmed with the voltage bias $V_{M\_3}$ has passed the programming verification or not.

In other words, the memory cell is firstly programmed with the voltage bias $V_{M\_1}$ (Stage 1) and reprogrammed until the programming verification is passed or until the program constrains are exceeded. Once the program constrains are exceeded, the memory cell is programmed with the voltage bias $V_{M\_2}$ (Stage 2) for a predetermined number of times. If the memory cell programmed with the voltage bias $V_{M\_2}$ fails the programming verification, the memory cell is programmed with the voltage bias $V_{M\_3}$ (Stage 3) for a predetermined number of times. The multi-stage program method ends regardless of the programming verification result of the memory programmed with the voltage bias $V_{M\_3}$.

The magnitudes of the voltage bias $V_{M\_1}$, $V_{M\_2}$ and $V_{M\_3}$ of the multi-stage program method are all predetermined. As shown in FIG. 7, the voltage bias $V_{M\_3}$ is typically greater than the voltage bias $V_{M\_2}$ and the voltage bias $V_{M\_2}$ is typically greater than the voltage bias $V_{M\_1}$. The voltage bias $V_{M\_1}$ applied to the memory cell is constant during re-programming of Stage 1.

In contrast to the prior art, the number of the programming voltage bias (i.e. the voltage bias $V_{M\_1}$, $V_{M\_2}$, and $V_{M\_3}$) of the present invention is finite and predetermined. The magnitudes of the voltage bias $V_{M\_1}$, $V_{M\_2}$, and $V_{M\_3}$ are also predetermined. The number of times the memory cell is programmed with the voltage bias $V_{M\_1}$, $V_{M\_2}$, and $V_{M\_3}$ are also predetermined. In other words, the impact of stress and component disturbance is controlled since the number of times the memory cell is programmed, and the number of different voltage bias applied to the memory cell are all predetermined, according to the design requirements. Furthermore, the damage of stress and component disturbance can also be forecasted since the magnitudes of the programming voltage bias are all predetermined; accordingly, the Stage 2 and Stage 3 of the multi-stage program method do not require a sensing circuit to provide feedbacks, resulting in a relative simple circuit design.

The algorithm of the above multi-stage program method according to the present invention can also be applied to the erasing operation of the nonvolatile memory. However, instead of processing a single memory cell of the nonvolatile memory at a time in the programming operation, the erasing operation processes a sector of the nonvolatile memory at a time. The sector of the nonvolatile memory comprises a plurality of memory cells. Although the principle and the operation of the multi-stage program method can be applied to the erasing operation of the nonvolatile memory, the magnitudes of the voltage bias $V_{M\_1}$, $V_{M\_2}$ and $V_{M\_3}$ utilized in the erasing operation are different to the programming operation. Similar to the programming operation, in the erasing operation, the voltage bias $V_{M\_3}$ is typically greater than the voltage bias $V_{M\_2}$ and the voltage bias $V_{M\_2}$ is typically greater than the voltage bias $V_{M\_1}$. The voltage bias $V_{M\_1}$ applied to erase the memory cell is still constant during re-erasing of Stage 1.

Please note that the above embodiments of the multi-stage program method are merely exemplary illustrations of the present invention, those skilled in the art can certainly make appropriate modifications according to practical demands, such as setting a different program constrain or re-program the memory cell with the voltage bias $V_{M\_1}$ for a different number of retries, which also belongs to the scope of the present invention.

In conclusion, the method for programming/erasing a nonvolatile memory according to the present invention uses the multi-stage pulses to program/erase the memory so as to reduce slow program/erase bits. The method applies a first predetermined voltage bias to the memory for a predetermined number of times. Each time the voltage bias is applied to the memory cell the memory is verified against a criterion. If the verification failed after the predetermined number of times applying the first predetermined voltage bias, a second predetermined voltage bias is applied to program/erase the nonvolatile memory for a predetermined number of times. If all the verification failed after applying the second predetermined voltage bias, a third predetermined voltage bias is applied to program/erase the nonvolatile memory for a predetermined number of times. By modifying the programming/erasing voltage bias for the predetermined number of times and predetermining the magnitudes of the modified programming/erasing voltage bias, the slow program bit can be effectively reduced while maintaining a relatively simple circuit design, as well as limiting the component disturbance.

Those skilled in the art will readily observe that numerous modifications and alterations of the device and method may be made while retaining the teachings of the invention.

What is claimed is:

1. A method for programming/erasing a nonvolatile memory, comprising:
    applying a first predetermined voltage bias to the nonvolatile memory for a predetermined number of times;
    performing a first verification after each time applying the first predetermined voltage bias to the nonvolatile memory; and
    applying a second predetermined voltage bias to the nonvolatile memory after the first verification has failed for the predetermined number of times.

2. The method of claim 1, wherein the second predetermined voltage bias is greater than the first predetermined voltage bias.

3. The method of claim 1, wherein applying the second predetermined voltage bias to the nonvolatile memory is applying the second predetermined voltage bias to the nonvolatile memory for a predetermined number of times.

4. The method of claim 1, wherein performing the first verification comprises verifying current, voltage, or threshold voltage of the nonvolatile memory with a criterion.

5. The method of claim 1 further comprising:
    performing a second verification after applying the second predetermined voltage bias to the nonvolatile memory.

6. The method of claim 5 further comprising:
    applying a third predetermined voltage bias to the nonvolatile memory after the second verification has failed.

7. The method of claim 6, wherein the third predetermined voltage bias is greater than the second predetermined voltage bias.

8. The method of claim 6, wherein applying the third predetermined voltage bias to the nonvolatile memory is applying the third predetermined voltage bias to the nonvolatile memory for a predetermined number of times.

9. The method of claim 1, wherein when programming the nonvolatile memory, applying the first predetermined voltage bias to a memory cell of the nonvolatile memory for the predetermined number of times; and applying the second predetermined voltage bias to the memory cell of the nonvolatile memory.

10. The method of claim 9, further comprising:
applying a third predetermined voltage bias to the memory cell of the nonvolatile memory.

11. The method of claim 1, wherein when erasing the nonvolatile memory, applying the first predetermined voltage bias to a sector of the nonvolatile memory for the predetermined number of times; and applying the second predetermined voltage bias to the sector of the nonvolatile memory.

12. The method of claim 11, further comprising:
applying a third predetermined voltage bias to the sector of the nonvolatile memory.

* * * * *